(12) United States Patent
Song et al.

(10) Patent No.: US 9,520,386 B2
(45) Date of Patent: Dec. 13, 2016

(54) LIGHT SOURCE UNIT AND BACKLIGHT ASSEMBLY HAVING THE SAME

(71) Applicant: Samsung Display Co., Ltd., Yongin, Gyeonggi-Do (KR)

(72) Inventors: Si Joon Song, Suwon-si (KR); Hyuk Hwan Kim, Hwaseong-si (KR); Seok Hyun Nam, Seoul (KR); Byoung Dae Ye, Yongin-si (KR); Young Keun Lee, Suwon-si (KR)

(73) Assignee: Samsung Display Co., Ltd. (KR)

( * ) Notice: Subject to any disclaimer, the term of this patent is extended or adjusted under 35 U.S.C. 154(b) by 105 days.

(21) Appl. No.: 14/262,438

(22) Filed: Apr. 25, 2014

(65) Prior Publication Data
US 2015/0138827 A1    May 21, 2015

(30) Foreign Application Priority Data

Nov. 15, 2013 (KR) .................. 10-2013-0139144

(51) Int. Cl.
*F21S 4/00*  (2016.01)
*F21V 21/00* (2006.01)
*H01L 25/16* (2006.01)
*F21V 8/00*  (2006.01)

(52) U.S. Cl.
CPC .......... *H01L 25/167* (2013.01); *G02B 6/0073* (2013.01); *G02B 6/0083* (2013.01); *H01L 2224/48091* (2013.01); *H01L 2224/48247* (2013.01)

(58) Field of Classification Search
CPC .. G02B 6/0073; G02F 1/133603; H01L 23/60; H01L 23/62; H01L 25/167

USPC .................. 362/249.02, 612, 630–631, 800
See application file for complete search history.

(56) References Cited

U.S. PATENT DOCUMENTS

| | | | |
|---|---|---|---|
| 6,407,411 B1 | 6/2002 | Wojnarwoski et al. | |
| 7,465,884 B2 | 12/2008 | Ooyabu et al. | |
| 8,049,229 B2 | 11/2011 | Yoon | |
| 9,240,535 B2 * | 1/2016 | Yoshida | H01L 33/62 |
| 2012/0201007 A1 * | 8/2012 | Yeh | H05K 1/0203 361/719 |

FOREIGN PATENT DOCUMENTS

| | | |
|---|---|---|
| KR | 10-0699146 B1 | 3/2007 |
| KR | 10-0765699 A | 10/2007 |
| KR | 10-2008-0087251 A | 1/2008 |

(Continued)

*Primary Examiner* — Jason Moon Han
(74) *Attorney, Agent, or Firm* — Innovation Counsel LLP

(57) ABSTRACT

A method of protecting an LED chip from damage by ESD and EMI when the LED chip is housed in a light-emitting diode(s) housing package (LED package) and the LED package is mounted on a printed circuit board is provided. The method comprises a step of not including an ESD and EMI suppressing Zener diode within the combination of the printed circuit board and the LED package and of providing within the combination of the printed circuit board and the LED package a first conductive member and a spaced apart second conductive member which are electrically connected to the LED chip and which have defined between them at least one insulative ESD and/or EMI suppressing region which breaks down in its insulative properties when subjected to voltages of absolute magnitudes greater than a predetermined threshold voltage.

9 Claims, 15 Drawing Sheets

(56) References Cited

FOREIGN PATENT DOCUMENTS

| KR | 10-1103296 B1 | 1/2012 |
| KR | 10-2013-0012947 A | 2/2013 |
| KR | 10-1239857 A | 3/2013 |
| KR | 10-2013-0055203 A | 5/2013 |
| KR | 10-2013-0057675 A | 6/2013 |

* cited by examiner

LIGHT SOURCE UNIT AND BACKLIGHT ASSEMBLY HAVING THE SAME This application claims priority from Korean Patent Application No. 10-2013-0139144 filed on Nov. 15, 2013 in the Korean Intellectual Property Office, the disclosure of which application is incorporated herein by reference in its entirety.

BACKGROUND

1. Field of Disclosure

The present disclosure of invention relates to a light source unit and a backlight assembly having the same.

2. Description of Related Technology

Liquid crystal displays (LCDs) are some of the most widely used types of flat or otherwise thin panel displays (FPDs). Generally, an LCD includes two substrates having electrodes and a liquid crystal layer interposed between the substrates. In an LCD, voltages are applied to the electrodes to thereby rearrange liquid crystal molecules of a liquid crystal layer, thereby controlling an amount of light that passes through the liquid crystal layer and one or more polarizers.

Being a passive light-emitting type of device, the typical transmissive type LCD requires a backlight assembly which provides light that is to pass through the liquid crystal layer. Examples of light sources that may be used in the backlight assembly may include a cold cathode fluorescent lamp (CCFL), an external electrode fluorescent lamp (EEFL), and a light-emitting diode (LED). Currently, there is a growing demand for backlight assemblies using high-luminance LEDs.

Individual LED's can be provided as integrated within an LED package. Such LED packages may be arranged on a circuit board and used as light sources for a corresponding LCD.

An LED package typically includes a Zener diode that is connected within the package so as to protect the internal LED's from electrostatic discharge (ESD) and electromagnetic interference (EMI). The Zener diode is typically connected in parallel to the LED's and protects the LED's from unexpected ESD and/or EMI.

However, if such a Zener diode is integrally included in each LED package, the size of each LED package inevitably increases. In addition, the increased size of the LED packages leads to an increase in the size of the backlight assembly and of the display device which includes the Zener-including LED packages. Furthermore, since the process of mounting the Zener diode is added to the manufacture of each package, the number of processes and cost required to manufacture all the LED packages used within the LCD increases and the cost of the LCD increases.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

Aspects of the present disclosure of invention include a method of protecting an LED chip from damage by ESD (electrostatic discharge) and EMI (electromagnetic interference) when the LED chip is housed in a light-emitting diode(s) housing package (LED package) and the LED package is mounted on a printed circuit board. The method comprises a step of not including an ESD and EMI suppressing Zener diode within the combination of the printed circuit board and the LED package and of providing within the combination of the printed circuit board and the LED package a first conductive member and a spaced apart second conductive member which are electrically connected to the LED chip and which have defined between them at least one insulative ESD and/or EMI suppressing region which breaks down in its insulative properties when subjected to voltages of absolute magnitudes greater than a predetermined threshold voltage.

However, aspects of the present disclosure of invention are not restricted to the specific ones set forth herein. The above and other aspects of the present disclosure will become more apparent to one of ordinary skill in the art to which the present disclosure of invention pertains by referencing the detailed description given below.

According to an aspect of the present disclosure, there is provided a light source unit comprising a light-emitting diode(s) housing package (LED package) which comprise an LED chip, and a circuit board on which the LED package is mounted, wherein the circuit board comprises a first conductive member and a spaced apart second conductive member which are electrically connected to the LED chip, wherein the first conductive member is located on a side of the LED package, the second conductive member is located on the other side of the LED package which is opposite the side of the LED package, and the first conductive member comprises a first protrusion which protrudes toward the second conductive member.

A minimum distance between the first protrusion and the second conductive member may be smaller than a minimum distance between the first conductive member and the second conductive member in a portion where the first protrusion is not formed.

The second conductive member may comprise a second protrusion which protrudes toward the first conductive member The first protrusion and the second protrusion may face each other.

The first protrusion and the second protrusion may be symmetrical to each other with respect to a virtual line that halves an area between the first conductive member and the second conductive member.

The first protrusion and the second protrusion may be arranged alternately.

Each of the first protrusion and the second protrusion may be bent at least once, wherein bent portions of the first protrusion may be located between portions of the second conductive member, and bent portions of the second protrusion may be located between portions of the first conductive member.

Each of the first protrusion and the second protrusion may be bent multiple times in a clockwise direction or a counterclockwise direction to be electrically connected to the LED chip.

According to another aspect of the present disclosure of invention, there is provided a light source unit comprising an LED package, and a circuit board on which the LED package is mounted, wherein the LED package comprises an LED chip, and a first lead frame and a second lead frame which are electrically connected to the LED chip, wherein the first lead frame comprises a first protrusion which protrudes toward the second lead frame.

A minimum distance between the first protrusion and the second lead frame may be smaller than a minimum distance between the first lead frame and the second lead frame in a portion where the first protrusion is not formed.

The second lead frame may comprise a second protrusion which protrudes toward the first lead frame.

The first protrusion and the second protrusion may face each other.

The first protrusion and the second protrusion may be symmetrical to each other with respect to a virtual line that halves an area between the first lead frame and the second lead frame.

The light source unit may further comprise a housing which fixes the LED chip, the first lead frame, and the second lead frame.

According to still another aspect of the present disclosure of invention, there is provided a backlight assembly comprising a light source unit comprising an LED package which comprises an LED chip and a circuit board on which the LED package is mounted, and an accommodating housing which houses the light source unit, wherein the circuit board comprises a first conductive member and a second conductive member which are electrically connected to the LED chip, wherein the first conductive member is located on a side of the LED package, the second conductive member is located on the other side of the LED package which is opposite the side of the LED package, and the first conductive member comprises a first protrusion which protrudes toward the second conductive member.

A minimum distance between the first protrusion and the second conductive member may be smaller than a minimum distance between the first conductive member and the second conductive member in a portion where the first protrusion is not formed.

The second conductive member may comprise a second protrusion which protrudes toward the first conductive member.

The first protrusion and the second protrusion may face each other.

The backlight assembly may further comprise a light guide plate (LGP) which is placed to face the LED package and guides light emitted from the LED chip such that the light can exit the LGP through an exit surface.

The backlight assembly may further comprise a diffusion sheet which is disposed on the exit surface of the LGP and diffuses light emerging from the exit surface of the LGP, and a reflective sheet which is disposed between the LGP and the accommodating housing and reflects light leaked from the LGP back to the LGP.

BRIEF DESCRIPTION OF THE DRAWINGS

The above and other aspects and features of the present disclosure of invention will become more apparent by describing in detail exemplary embodiments thereof with reference to the attached drawings, in which.

DETAILED DESCRIPTION

Figure 1:
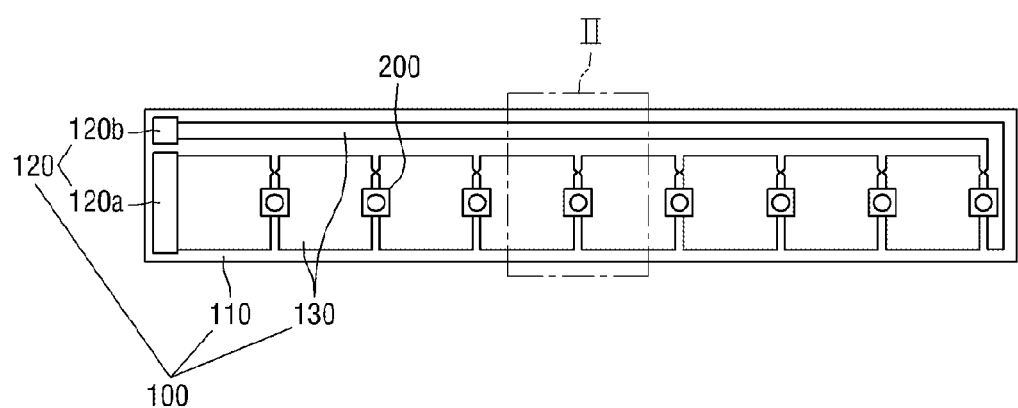
FIG. 1 is a plan view of a light source unit according to an embodiment of the present disclosure.

The aspects and features of the present disclosure of invention and methods for achieving the aspects and features will be apparent by referring to the embodiments to be described in detail with reference to the accompanying drawings. However, the present teachings are not limited to the embodiments disclosed hereinafter, but can be implemented in diverse forms based on the teachings. The matters defined in the description, such as the detailed construction and elements, are merely specific and nonlimiting details provided to assist those of ordinary skill in the art in a comprehensive understanding of the present disclosure of invention.

The term "on" that is used to designate that an element is on another element or located on a different layer or a layer includes both a case where an element is located directly on another element or a layer and a case where an element is located on another element via another layer or still another element. In the entire description, the same drawing reference numerals are used for same or alike elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments of the present disclosure will be described with reference to the attached drawings.

FIG. 1 is a plan view of a light source unit according to a first embodiment of the present disclosure. Referring to FIG. 1, the light source unit according to the current embodiment includes a printed circuit board 100 and a light-emitting diode(s) (LED) package 200.

The circuit board 100 may includes a support plate (substrate) 110, a connector 120, and a pattern of conductive members 130.

The support plate 110 may support the connector 120 and the conductive members 130. The support plate 110 may be shaped like a rectangle extending in a direction. The support plate 110 may be formed of a rigid member such as a glass substrate. However, the present disclosure is not limited thereto, and the support plate (substrate) 110 may also or instead be formed of a flexible insulative member such as a polyimide substrate. In addition to a base insulator, the support plate 110 may include an insulation enhancing material. Here, the insulation enhancing material may include, but is not limited to, one or more of a silicon nitride, a silicon oxide and a silicon oxynitride (SiOxNy).

The connector 120 may be located on an end of the support plate 110. The connector 120 may be a connection terminal used to apply an external voltage to the LED package(s) 200 which will be described later. The connector 120 may include a first pin 120a to which an external driving voltage is applied and a second pin 120b to which an external ground voltage is applied.

The patterned conductive members 130 may be located on a surface of the support plate 110 on which the connector 120 is disposed. The conductive members 130 may be formed of a conductive material, for example, a metal such as copper or silver.

The conductive members 130 may be provided as a plurality of different conductive materials for example provided as a laminated stack of conductive layers. The conductive members 130 may be separated from each other. Two of the conductive members 130 may be connected respectively to the first pin 120a and the second pin 120b so as to receive external voltages. The conductive members 130 not connected to the first pin 120a and the second pin 120b may be separated from each other and arranged in a line.

The LED package 200 may be mounted on the circuit board 100. Specifically, the LED package 200 may be located at a boundary between two adjacent but not shorted together conductive members 130. In an exemplary embodiment, the LED package 200 may overlap respective edges of two adjacent conductive members 130. The specific structure of the LED package 200 will be described in detail later.

The LED package 200 may be provided as a plurality of LED packages each containing one or more LED's or same and/or different output colors. In FIG. 1, eight LED packages 200 are illustrated. However, the present disclosure is not limited thereto, and n LED packages 200 may also be provided, where n is a natural number of two or more. The LED packages 200 may be separated from each other. In addition, the LED packages 200 may be arranged in a line. However, the present disclosure is not limited thereto, and the LED packages 200 may also be arranged in a matrix. Additionally, the illustrated sizes of the LED packages 200 are not to scale and the LED packages 200 may consume greater portions of the available surface area than what is illustrated.

Figure 2:
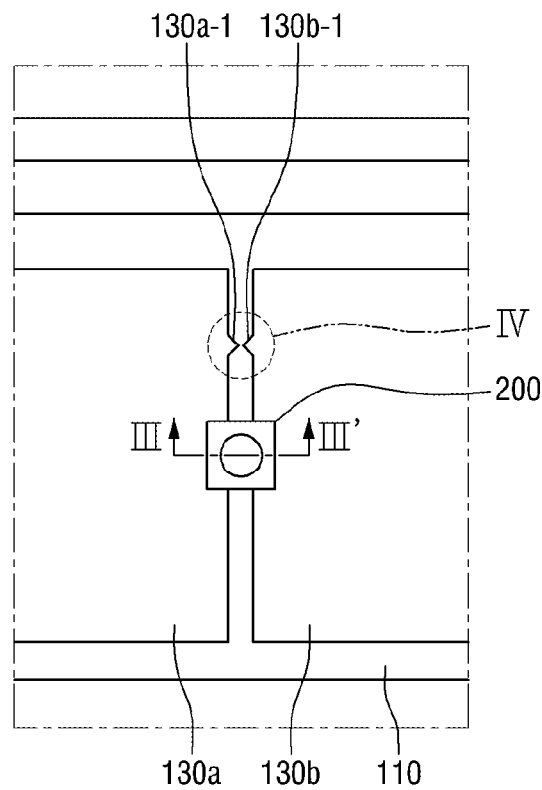
FIG. 2 is an enlarged view of a portion II of FIG. 1.

FIG. 2 is an enlarged view of a portion II of FIG. 1. Referring to FIG. 2, the conductive members 130 include a first conductive member 130a and a second conductive member 130b. Here, the first conductive member 130a and the second conductive member 130b are relative features whose specifics depend on correspondingly specific aspects of the overlying LED package 200. That is, if the LED package 200 has only two and opposed terminals, the conductive members 130 located on a first side of the LED package 200 may be the first conductive member 130a, and the conductive members 130 located on the opposed other side of the LED package 200 may be the second conductive member 130b. This is based on the LED package 200 shown in FIG. 2, where the latter is, a fourth LED package 200 from the left side of FIG. 1. In other words, the second conductive member 130b may be the same as a first conductive member defined based on a fifth LED package 200 from the left side of FIG. 1.

There is a general spacing apart area between the first and second conductive members 130a and 130b. However, the first conductive member 130a includes a first protrusion 130a-1 which protrudes into the general spacing apart area and extends toward the second conductive member 130b. Similarly, the second conductive member 130b includes a second protrusion 130b-1 which protrudes into the general spacing apart area and extends toward the first conductive member 130a and optionally in at least one embodiment toward the first protrusion 130a-1. The first protrusion 130a-1 and the second protrusion 130b-1 will be described in greater detail later.

Figure 3:
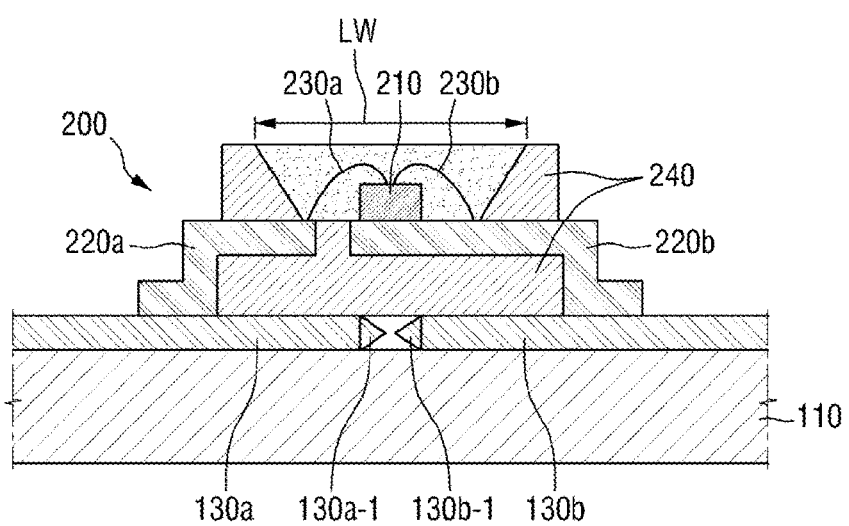
FIG. 3 is a cross-sectional view taken along the line III-III' of FIG. 2.

The specific structure of each of the LED packages 200 and the relationship between the LED packages 200 and the first and second conductive members 130a and 130b will now be described with reference to FIG. 3. FIG. 3 is a cross-sectional view taken along the line III-III' of FIG. 2.

Referring to FIG. 3, an LED package 200 may include at least one LED chip such as the illustrated 210, where the LED chip 210 has monolithically integrated therein, one or more light emitting diodes of same or different light emitting capabilities (e.g., same or different colors). The LED package 200 may further include a first lead frame 220a, a second lead frame 220b, a first wire 230a, a second wire 230b, a housing 240, and a light-passing (e.g., transparent) encapsulant 250.

The LED chip 210 is a device that emits one or more lights in response to electric power applied thereto. The LED chip 210 is disposed on the second lead frame 220b. Although not specifically shown in FIG. 3, the LED chip 210 includes a substrate, an N-type semiconductor layer, a P-type semiconductor layer, an active layer, an N-type electrode, and a P-type electrode.

The substrate included in the LED chip 210 may mostly be a sapphire substrate. The N-type semiconductor layer and the P-type semiconductor layer may be formed of a nitride semiconductor such as GaN, AlGaN, InGaN, AlN, or AlInGaN. The active layer may be a light-emitting layer formed between the N-type semiconductor layer and the P-type semiconductor layer. The active layer may have a multi-quantum well (MQW) structure including an InGaN layer as a well and a GaN layer as a barrier layer. The N-type electrode may be ohmically connected to the N-type semiconductor layer, and the P-type electrode may be ohmically connected to the P-type semiconductor layer. The above configuration of the LED chip 210 can be modified into various forms known in the art to which the present disclosure of invention pertains.

The first lead frame 220a may be located on a first side of the LED package 200. In an exemplary embodiment, the first lead frame 220a may be formed of a conductive material having a step difference. The first lead frame 220a may be formed of the same material as the conductive members 130.

A first end of the first lead frame 220a may be electrically connected to the P-type electrode of the LED chip 210. In addition, a second end of the first lead frame 220a which is opposite the first end of the first lead frame 220a may directly contact the first conductive member 130a. That is, the first lead frame 220a may be electrically connected to the first conductive member 130a.

The second lead frame 220a may be located on a second side of the LED package 200 which is opposite the first side of the LED package 200. In an exemplary embodiment, the second lead frame 220b may be formed of a conductive material having a step difference. The second lead frame 220b may be formed of the same material as the conductive members 130. In addition, the second lead frame 220b may be formed of the same material as the first lead frame 220a.

A first end of the second lead frame 220b may be electrically connected to the P-type electrode of the LED chip 210. In addition, a second end of the second lead frame 220b which is opposite the first end of the second lead frame 220b may directly contact the second conductive member 130b. That is, the second lead frame 220b may be electrically connected to the second conductive member 130b. In addition, as described above, the LED chip 210 may be located on a surface of the second lead frame 220b. In addition to good electrical conductivity, each of the first and second lead frames 220a-220b may have the attribute of good thermal conductivity so that heat generated within the LED chip 210 may be appropriately dissipated by way of one or both of the lead frames 220a-220b.

The first lead frame 220a and the second lead frame 220b may be disposed opposite each other. Specifically, the first end of the first lead frame 220a and the first end of the second lead frame 220b may face each other.

The first wire 230a may electrically connect the P-type electrode of the LED chip 210 and the first lead frame 220a. The second wire 230b may electrically connect the N-type electrode of the LED chip 210 and the second lead frame 220b.

The housing 240 may contain and affix the LED chip 210 therein as well as also containing the first lead frame 220a, the second lead frame 220b, the first wire 230a and the second wire 230b. At least one of the housing 240, the first lead frame 220a and the second lead frame 220b is affixed to a corresponding one of the first conductive member 130a and the second conductive member 130b. The housing 240 may have a recess formed in a portion thereof where the LED chip 210 is located. Since light is emitted from inside the recess, the planar area of the recess may be called a light-emitting window LW. In an exemplary embodiment, the housing 240 may be cup-shaped. In addition, the housing 240 may be manufactured by, but not limited to, injection molding. The housing 240 may be formed of an insulating material. In addition, the housing 240 may include a reflective material. That is, the housing 240 may reflect light emitted from the LED chip 210 in a desired direction.

The encapsulant 250 may not only affix the LED chip 210 as well as the first wire 230a and the second wire 230b within the housing 240 but may also protect the LED chip 210, the first wire 230a, and the second wire 230b from external contaminants and other damaging effects. The encapsulant 250 may fill the recess formed in the housing 240. In an exemplary embodiment, the encapsulant 250 may be formed of transparent silicon. In another exemplary embodiment, the encapsulant 250 may be formed of transparent resin. The encapsulant 250 may include one or more phosphors that convert part or all of a color of light emitted from the LED chip 210 into a respective one or more other colors. For example, the LED chip 210 may emit light in the blue end of the spectrum and the phosphors may convert part of that bluish light into red and green lights.

The LED package 200 may be disposed on the first conductive member 130a and the second conductive member 130b. The first conductive member 130a and the second conductive member 130b may be electrically connected to the LED chip 210 of the LED package 200. That is, the first conductive member 130a and the second conductive member 130b may transfer an external voltage applied from the connector 120 (see FIG. 1) to the LED chip 210, thereby causing the LED chip 210 to emit light.

Figure 4:
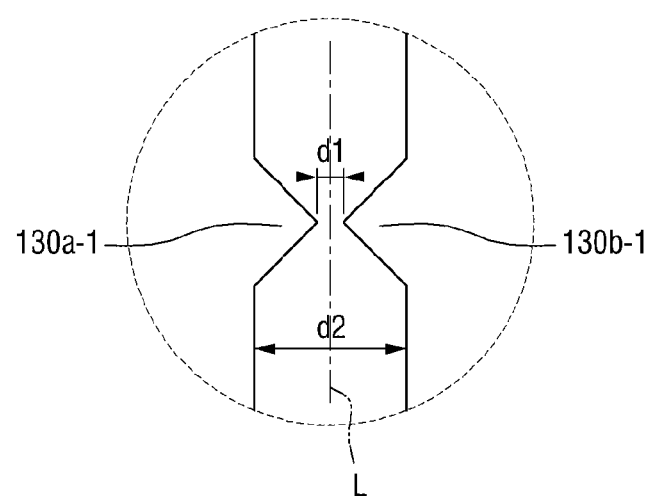
FIG. 4 is an enlarged view of a portion IV of FIG. 2.

The first protrusion 130a-1 and the second protrusion 130b-1 will now be described in detail with reference to FIGS. 2 through 4. FIGS. 2 and 3 have been described above. FIG. 4 is an enlarged view of a portion IV of FIG. 2, that is, a portion where the first protrusion 130a-1 and the second protrusion 130b-1 are located.

The first protrusion 130a-1 may protrude from an edge of the first conductive member 130a, which faces the second conductive member 130b, toward the second conductive member 130b. On the other hand, the second protrusion 130b-1 may protrude from an edge of the second conductive member 130b, which faces the first conductive member 130a, toward the first conductive member 130a. The second protrusion 130b-1 can be omitted. That is, only the first protrusion 130a-1 may exist, and the second protrusion 130b-1 may not exist.

Each of the first protrusion 130a-1 and the second protrusion 130b-1 may have a sharp or pointed end. In an exemplary embodiment, the first protrusion 130a-1 and the second protrusion 130b-1 may have a triangular shape as seen from one or both of the top plan view and side sectional view. In another exemplary embodiment, the first protrusion 130a-1 and the second protrusion 130b-1 may have a sharply tapered shape similar to the shape of the eye of a needle. However, the present disclosure of invention is not limited thereto, and the first protrusion 130a-1 and the second protrusion 130b-1 can have various shapes adapted for providing the spark gap functions described herein.

An air or other gas layer may be interposed between the first protrusion 130a-1 and the second protrusion 130b-1. However, the present disclosure of invention is not limited thereto, and an insulating layer with appropriate high voltage breakdown attributes may also be interposed between the first protrusion 130a-1 and the second protrusion 130b-1.

Referring to FIG. 4, the first protrusion 130a-1 and the second protrusion 130b-1 may face each other. In an exemplary embodiment, the first protrusion 130a-1 and the second protrusion 130b-1 may be symmetrical to each other with respect to a virtual line L that halves an area between the first conductive member 130a and the second conductive member 130b. In addition, a minimum distance d1 between the first protrusion 130a-1 and the second protrusion 130b-1 may be smaller than a minimum distance d2 between the first conductive member 130a and the second conductive member 130b in a portion where the first protrusion 130a-1 and the second protrusion 130b-1 are not formed. Accordingly, when a dangerously high voltage (such as that from electrostatic discharge) is applied to the light source unit, an overcurrent may flow between the first protrusion 130a-1 and the second protrusion 130b-1. Here, a spark may occur in a portion where the first protrusion 130a-1 and the second protrusion 130b-1 are located. That is, the first protrusion 130a-1 and the second protrusion 130b-1 may form a spark gap that breaks down and sparks when subjected to voltages above a predetermined threshold, thereby protecting the LED package 200 from electrostatic discharge (ESD) and electromagnetic interference (EMI).

Figure 5:
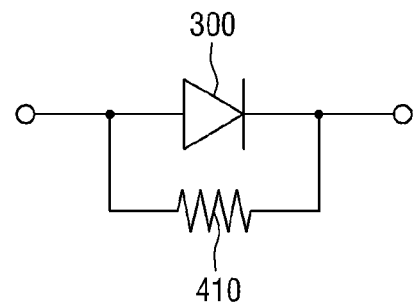
FIG. 5 is an equivalent circuit diagram of a portion of the light source unit of FIG. 1.

The above function will now be described in more detail with reference to FIG. 5. FIG. 5 is an equivalent circuit diagram of a portion of the light source unit of FIG. 1. That is, FIG. 5 is an equivalent circuit diagram of one LED package 200 and the circuit board 100 adjacent to the LED package 200.

Referring to FIG. 5, an LED 300 and an equivalent nonlinear resistor 410 may be connected in parallel. Here, the LED 300 may be the LED chip 210 described above, and the equivalent nonlinear resistor 410 may represent the electrical characteristics of the area between the first protrusion 130a-1 and the second protrusion 130b-1. That is, the first protrusion 130a-1 and the second protrusion 130b-1 form the equivalent but nonlinear resistor 410 which is connected in parallel to the LED 300. In accordance with the present disclosure, the resistance of the equivalent but nonlinear resistor 410 drops dramatically when voltage thereacross exceeds a predetermined threshold. Thus, when a high voltage exceeding that threshold is applied to the light source unit, it is possible to prevent a damaging overcurrent from flowing through the LED chip 210.

The light source unit according to the current embodiment can provide various effects in addition to the above-described function of protecting the LED chip 210. For example (but not limited to this example), since a Zener diode is not included, the overall size of the LED package 200 can be reduced. A reduction in the size of the LED package 200 can directly lead to a reduction in the size of a final product, for example, the size of a display device. In addition, since the expensive Zener diode is not used, the time and cost needed to manufacture the LED package 200 and the light source unit having the LED packages with Zeners included can be reduced. Furthermore, the absence of the Zener diode can increase the size of the light-emitting window LW (see FIG. 3), and the increased size of the light-emitting window LW can directly contribute to an increase in the optical efficiency of the LED package 200. For example, the increased size of the light-emitting window LW can increase luminous intensity by approximately 5%. Accordingly, the number of LED packages 200 included in the light source unit can be reduced.

FIGS. 6 through 9 are partial enlarged views of light source units according to other embodiments in accordance with the present disclosure. That is, FIGS. 6 through 9 are enlarged views of first protrusions 130a-2, 130a-3, 130a-4 and 130a-5 and second protrusions 130b-2, 130b-3 and 130b-4 of the light source units. For convenience of description, elements substantially identical to those shown in the above-described figures are indicated by the same reference numerals, and thus a detailed description thereof will be omitted.

Figure 6:
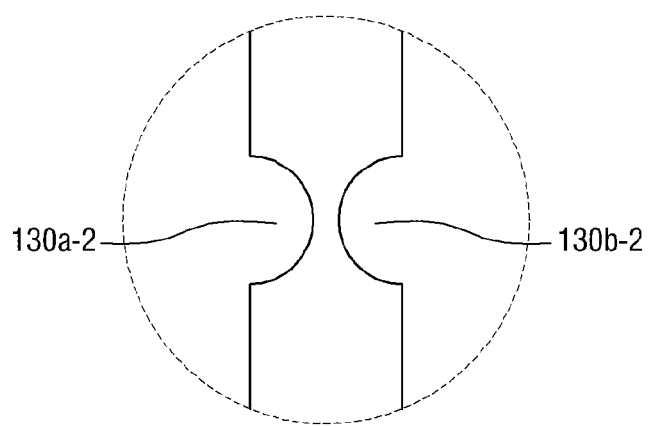
FIGS. 6 through 9 are partial enlarged views of light source units according to other embodiments of the present disclosure.

Referring to FIG. 6, an end of each of the first protrusion 130a-2 and the second protrusion 130b-2 may have a curved shape. In an exemplary embodiment, each of the first protrusion 130a-2 and the second protrusion 130b-2 may be semicircular. However, the present teachings are not limited thereto, and one or both of the first protrusion 130a-2 and the second protrusion 130b-2 may instead be semielliptical or another curved shape.

Figure 7:
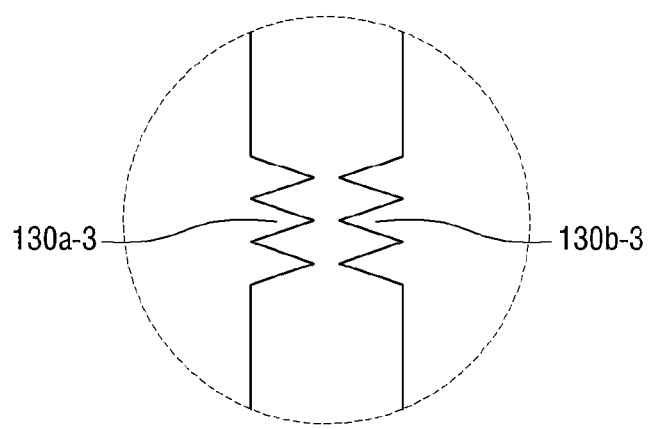

Referring to FIG. 7, each of the first protrusion 130a-3 and the second protrusion 130b-3 may include a plurality of sub-protrusions or fork tongs. All of the sub-protrusions in one embodiment may have substantially the same shape, for example, a triangle as viewed from at least one of top plan and side sectional views. In addition, the sub-protrusions may be disposed adjacent to each other. The sub-protrusions of the first protrusion 130a-3 may correspond to the sub-protrusions of the second protrusion 130b-3, respectively. Specific designs of shapes and dimensions may vary depending on the electrical breakdown characteristics of the intervening material(s) between the plural sub-protrusions or fork tongs and the way in which electrical flux fields distribute therebetween before and after dielectric breakdown.

Figure 8:
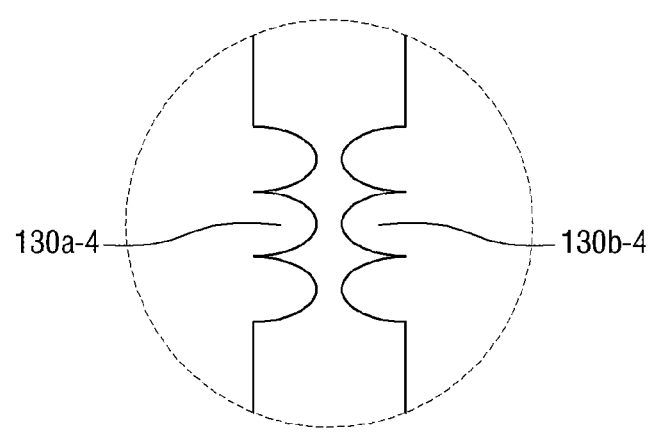

Referring to FIG. 8, each of the first protrusion 130a-4 and the second protrusion 130b-4 may include a plurality of sub-protrusions as in FIG. 7. However, the sub-protrusions may have a different shape from the shape of the sub-protrusions shown in FIG. 7. That is, in the exemplary embodiment of FIG. 8, each of the sub-protrusions included in each of the first protrusion 130a-4 and the second protrusion 130b-4 may be curved or more specifically, semicircular. However, the shape of each of the sub-protrusions is not limited to the semicircular shape.

Figure 9:
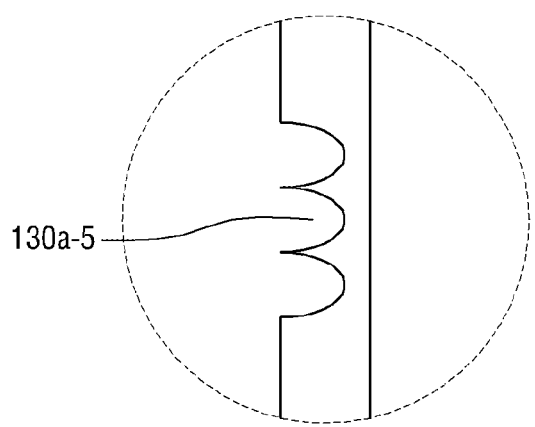

Referring to FIG. 9, the second protrusion 130b-4 of FIG. 8 may be omitted. That is, only the first protrusion 130a-5 may exist. In this case, the first protrusion 130a-5 may protrude further than the first protrusion 130a-4 shown in FIG. 8.

Figure 10:
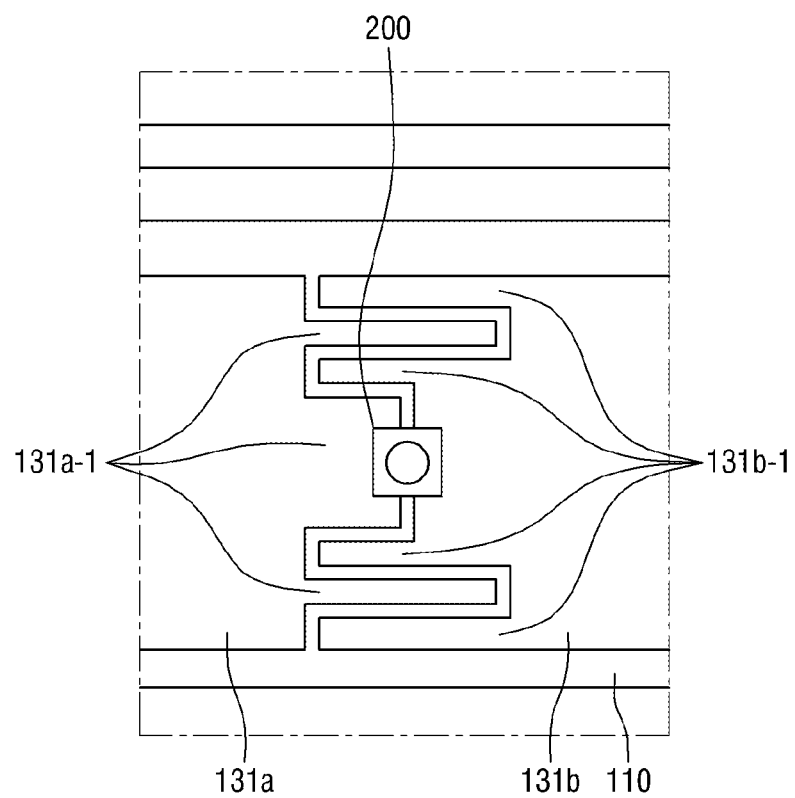
FIG. 10 is a partial enlarged view of a light source unit according to another embodiment in accordance with the present disclosure of invention.

FIG. 10 is a partial enlarged view of a light source unit according to another embodiment of the present disclosure of invention. That is, FIG. 10 is an enlarged plan view of one LED package 200 and a printed circuit board 100 adjacent to the LED package 200. For convenience of description, elements substantially identical to those shown in the above-described figures are indicated by the same reference numerals, and thus a detailed description thereof will be omitted.

Referring to FIG. 10, a first conductive member 131a may include a plurality of first protrusions 131a-1. Here, a protruding length of at least one of the first protrusions 131a-1 may be different from protruding lengths of the other first protrusions 131a-1. In addition, a second conductive member 131b may include a plurality of second protrusions 131b-1. Here, a protruding length of at least one of the second protrusions 131b-1 may be different from protruding lengths of the other second protrusions 131b-1.

The first protrusions 131a-1 may be arranged alternately with the second protrusions 131b-1. In the exemplary embodiment of FIG. 10, the first protrusions 131a-1 and the second protrusions 131b-1 may be arranged alternately in a vertical direction. In FIG. 10, the LED 200 is disposed on one of the first protrusions 131a-1 that is disposed between two of the second protrusions 131b-1. However, the present disclosure is not limited thereto, and the LED package 200 may also be disposed on a second protrusion 131b-1 that is disposed between two first protrusions 131a-1.

A boundary between the first conductive member 131a and the second conductive member 131b may be bent at least once. In an exemplary embodiment, the boundary between the first conductive member 131a and the second conductive member 131b may be in the shape of a winding river for example. That is, the boundary between the first conductive member 131a and the second conductive member 131b may be longer than when the boundary between the first conductive member 131a and the second conductive member 131b is formed like a straight line. A distance between the first conductive member 131a including the first protrusions 131a-1 and the second conductive member 131b including the second protrusions 131b-1 may be substantially the same in all areas.

Figure 11:
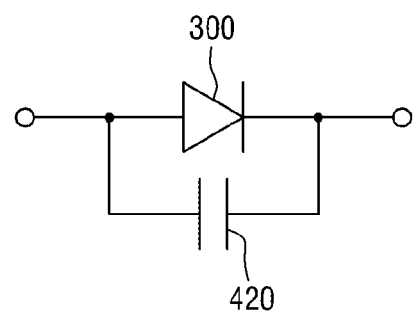
FIG. 11 is an equivalent circuit diagram of a portion of the light source unit shown in FIG. 10.

If the boundary between the first conductive member 131a and the second conductive member 131b is patterned by the first protrusions 131a-1 and the second protrusions 131b-1 as described above, the first conductive member 131a and the second conductive member 131b form a capacitor 420 (see FIG. 11), thereby protecting the LED package 200 from ESD and EMI. This will now be described in more detail with reference to FIG. 11. FIG. 11 is an equivalent circuit diagram of a portion of the light source unit shown in FIG. 10. That is, FIG. 11 is an equivalent circuit diagram of one LED package 200 and the circuit board 100 adjacent to the LED package 200.

Referring to FIG. 11, an LED 300 and a capacitor 420 may be connected in parallel. Here, the LED 300 may be the LED chip 210 described above, and the capacitor 420 may be an area between the first conductive member 131a and the second conductive member 131b. That is, the first conductive member 131a and the second conductive member 131b may form the capacitor 420 which is connected in parallel to the LED 300. The dielectric of the so-formed capacitor 420 may be one that breaks down above a predetermined threshold voltage. Thus, when an excessively high voltage greater than the predetermined threshold voltage is applied to the light source unit, it is possible to prevent an overcurrent from flowing through the LED chip 210.

Figure 12:
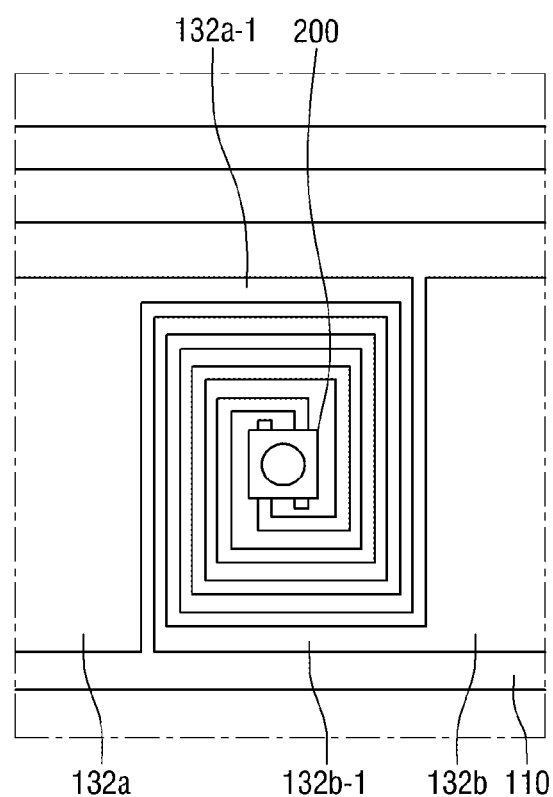
FIG. 12 is a partial enlarged view of a light source unit according to another embodiment of the present disclosure.

FIG. 12 is a partial enlarged view of a light source unit according to another embodiment of the present invention. That is, FIG. 12 is an enlarged plan view of one LED package 200 and a circuit board 100 adjacent to the LED package 200. For convenience of description, elements substantially identical to those shown in the above-described figures are indicated by the same reference numerals, and thus a detailed description thereof will be omitted.

Referring to FIG. 12, a first protrusion 132a-1 protruding from a first conductive member 132a and a second protrusion 132b-1 protruding from a second conductive member 132b may be bent one or more times so as to form inductive windings that are spaced apart from one another by a predetermined distance. In an exemplary embodiment, the first protrusion 132a-1 and the second protrusion 132b-1 may be bent multiple times at an angle of 90 degrees in each bend. In addition, each of the first protrusion 132a-1 and the second protrusion 132b-1 may be bent multiple times in a clockwise direction or a counterclockwise direction to be electrically connected to the LED package 200. In the exemplary embodiment of FIG. 12, the first protrusion 132a-1 and the second protrusion 132b-1 are bent multiple times in the clockwise direction while being spaced apart so as to thereby define an inductive-capacitive filtering structure that can protect the LED package 200 from high frequency ESD and/or EMI signals. Additionally, the dielectric material may be one that breaks down above a predetermined threshold voltage. The present embodiment is not limited to the inductive-capacitive filtering structure shown in FIG. 11. For example, the first protrusion 132a-1 and the second protrusion 132b-1 may also be bent multiple times in the counterclockwise direction. In this case, bent portions of the first protrusion 132a-1 may be located between portions of the second conductive member 132b. In addition, bent portions of the second protrusion 132b-1 may be located between portions of the first conductive member 132a.

By increasing the length of the boundary between the first conductive member 132a and the second conductive member 132b as described above, the capacitance of the capacitor 420 formed by the first conductive member 132a and the second conductive member 132b can be increased and inductance may be added to the filtering structure. If desired, a ferromagnetic material may be laminated over the windings to further increase the inductance thereof. The added ferromagnetic material may be embedded as particles in a dielectric material that breaks down above a predetermined threshold voltage.

Figure 13:
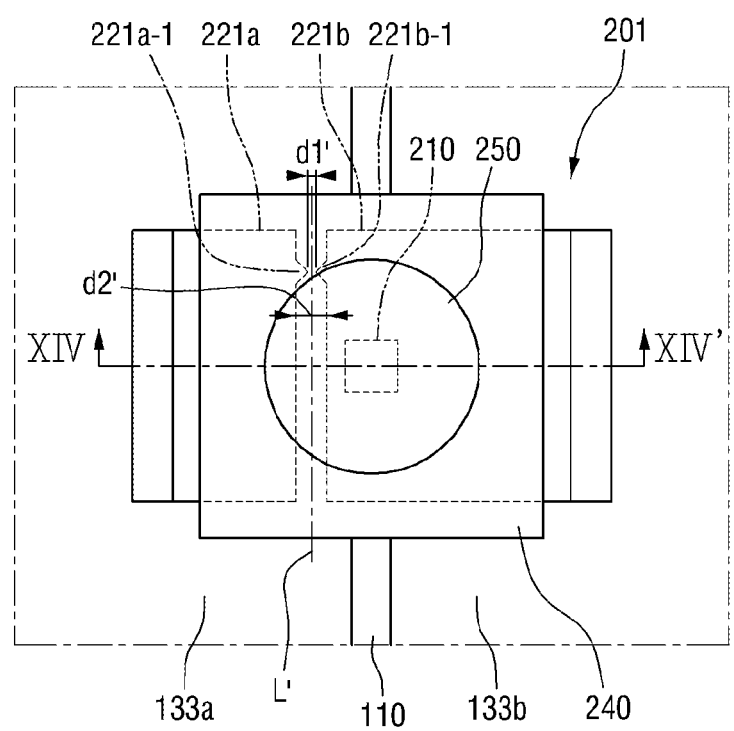
FIG. 13 is a partial enlarged view of a light source unit according to another embodiment of the present disclosure.
Figure 14:
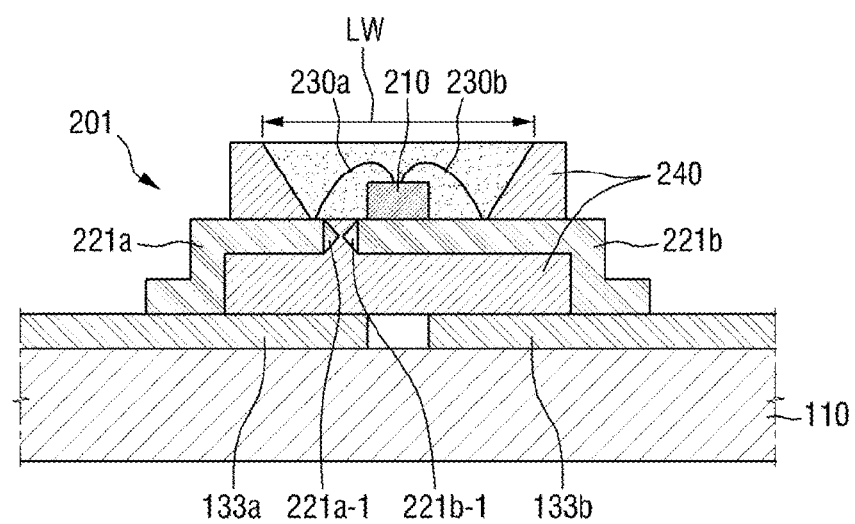
FIG. 14 is a cross-sectional view taken along the line XIV-XIV' of FIG. 13.

FIG. 13 is a partial enlarged view of a light source unit according to yet another embodiment in accordance with the present disclosure of invention. That is, FIG. 13 is an enlarged plan view of a portion where an LED package 201 is located. FIG. 14 is a cross-sectional view taken along the line XIV-XIV' of FIG. 13. For convenience of description, elements substantially identical to those shown in the above-described figures are indicated by the same reference numerals, and thus a detailed description thereof will be omitted.

Referring to FIGS. 13 and 14, a first conductive member 133a and a second conductive member 133b included in the printed circuit board 100 may or may not themselves include ESD and/or EMI reducing/preventing protrusions. However, within the packagings of the LED packages 201, at least a first lead frame 221a and a second lead frame 221b included in each LED package 201 includes ESD and/or EMI reducing/preventing protrusions.

Specifically, the first lead frame 221a may include a first protrusion 221a-1 which protrudes toward the second lead frame 221b. That is, the first protrusion 221a-1 may be formed at an end of the first lead frame 221a which faces the second lead frame 221b. In addition, the second lead frame 221b may include a second protrusion 221b-1 which protrudes toward the first lead frame 221a. That is, the second protrusion 221b-1 may be formed at an end of the second lead frame 221b which faces the first lead frame 221a. A material of or within the housing 240 may be interposed between the first protrusion 221a-1 and the second protrusion 221b-1. The interposed material of or within the housing 240 may be a dielectric one that breaks down above a predetermined threshold voltage. The second protrusion 221b-1 can be omitted when necessary.

Referring to FIG. 13, the first protrusion 221a-1 and the second protrusion 221b-1 may face each other. In an exemplary embodiment, the first protrusion 221a-1 and the second protrusion 221b-1 may be symmetrical to each other with respect to a virtual line L' that halves an area between the first lead frame 221a and the second lead frame 221b. In addition, a minimum distance d1' between the first protrusion 221a-1 and the second protrusion 221b-1 may be smaller than a minimum distance d2' between the first lead frame 221a and the second lead frame 221b-1 in a portion where the first protrusion 221a-1 and the second protrusion 221b-1 are not formed. Accordingly, when a high voltage is applied to the light source unit (in excess of the predetermined threshold voltage of the interposed material of or within the housing 240), an overcurrent may flow between the first protrusion 221a-1 and the second protrusion 221b-1 rather than passing through the LED 210. Here, a spark may occur in a portion where the first protrusion 221a-1 and the second protrusion 221b-1 are located. That is, the first protrusion 221a-1 and the second protrusion 221b-1 may form a spark gap, thereby protecting the LED package 201 from ESD and/or EMI and/or reducing the effect of damages caused by such ESD and/or EMI.

Figure 15:
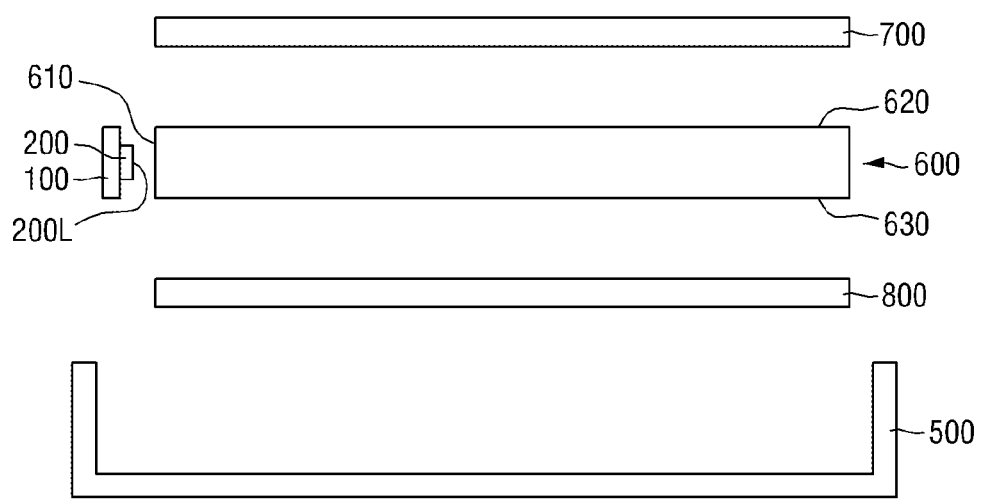
FIG. 15 is an exploded cross-sectional view of a backlight assembly according to an embodiment of the present disclosure.

FIG. 15 is an exploded cross-sectional view of a backlight assembly according to an embodiment of the present disclosure of invention. For convenience of description, elements substantially identical to those shown in the above-described figures are indicated by the same reference numerals, and thus a detailed description thereof will be omitted.

Referring to FIG. 15, the backlight assembly according to the current embodiment includes a light source unit (100-200) and an accommodating housing 500. In addition, the backlight assembly according to the current embodiment may include an edge-lit light guide plate (LGP) 600, a diffusion sheet 700, and a reflective sheet 800.

The light source unit may include a circuit board 100 and an LED package 200 mounted on the circuit board 100. Since this has been described above, a description thereof will be omitted.

The accommodating housing 500 may house the light source unit. In addition, the accommodating housing 500 may house the LGP 600, the diffusion sheet 700, and the reflective sheet 800 which will be described later. The accommodating housing 500 may be formed of a hard metal material to protect the light source unit, the LGP 600, the diffusion sheet 700, and the reflective sheet 800.

The LGP 600 may be placed to face the LED package 200 of the light source unit. The LGP 600 may be shaped like a quadrangular plate. The LGP 600 includes an incident surface 610 adjacent to the LED package 200, an exit surface 620 extending from a first end of the incident surface 610, and a reflective surface 630 parallel to the exit surface 620 and extending from a second end of the incident surface 610 which is opposite the first end of the incident surface 610.

Light emitted from the LED package 200 may be incident upon the incident surface 610 of the LGP 600. The light entering the LGP 600 through the incident surface 610 may exit the LGP 600 through the exit surface 620 or may be reflected by the reflective surface 630 and then exit the LGP 600 through the exit surface 620. To increase the focusing efficiency of light entering the LGP 600, a light-emitting surface 200L of the LED package 200 may be placed parallel to the incident surface 610 of the LGP 600. In FIG. 15, the light source unit is disposed on a side of the LGP 600. However, the present disclosure of invention is not limited thereto, and the light source unit may also be disposed under the LGP 600.

The backlight assembly may further include the diffusion sheet 700 which is disposed on the exit surface 620 and the reflective sheet 800 which is disposed between the LGP 600 and the housing 500. The reflective sheet 800 reflects light, which is leaked from the LGP 600, back to the LGP 600, and the diffusion sheet 700 diffuses light emerging from the LGP 600. Accordingly, the luminance of the backlight assembly can be improved.

The backlight assembly according to the current embodiment can protect devices (such as the light source unit) from ESD and/or EMI without using a Zener diode. In addition, since the backlight assembly includes the light source unit without the Zener diode, the overall size of the backlight assembly can be reduced. Furthermore, the removal of the Zener diode can increase the optical efficiency of the backlight assembly. In particular, the omission of the expensive Zener diode can reduce the cost and time needed to manufacture the backlight assembly.

Embodiments in accordance with the present disclosure of invention may provide at least one of the following advantages.

That is, it is possible to protect an LED from ESD and EMI without using a Zener diode.

In addition, it is possible to reduce the size of an LED package and the cost required to manufacture the LED package.

Furthermore, it is possible to increase the optical efficiency of the LED package.

However, the effects of the present teachings are not restricted to the one set forth herein. While the present disclosure of invention has been particularly shown and described with reference to exemplary embodiments thereof, it will be understood by those of ordinary skill in the art in view of the foregoing that various changes in form and details may be made therein without departing from the spirit and scope of the present teachings. It is therefore desired that the present embodiments be considered in all respects as illustrative and not restrictive.

What is claimed is:

1. A light source unit comprising:
   a light-emitting diode(s) housing package (LED package) which houses at least one LED chip; and
   a printed circuit board on which the LED package is mounted,
   wherein the printed circuit board comprises a support plate, a first conductive member disposed directly on the support plate and electrically connected to the LED chip, and a second conductive member disposed directly on the support plate, the second conductive member is spaced apart from the first conductive member and is electrically connected to the LED chip,
   wherein the first conductive member directly contacts a side of the LED package, the second conductive member directly contacts another side of the LED package which is opposite the side of the LED package, and the first conductive member comprises a first protrusion which protrudes toward the second conductive member, and the second conductive member comprises a second protrusion which protrudes toward the first protrusion,
   wherein the LED package and the first protrusion are spaced apart and connected electrically in parallel,
   wherein the first protrusion and second protrusion comprise a metal, and
   wherein the first protrusion and the second protrusion are disposed between the support plate and the LED package and are not disposed below the LED package.

2. The light source unit of claim 1, wherein a minimum distance between the first protrusion and the second conductive member is smaller than a minimum distance between the first conductive member and the second conductive member in a portion where the first protrusion is not formed.

3. The light source unit of claim 1, wherein the first protrusion and the second protrusion face each other.

4. The light source unit of claim 3, wherein the first protrusion and the second protrusion are symmetrical to each other with respect to a virtual line that halves an area between the first conductive member and the second conductive member.

5. The light source unit of claim 1, wherein the first protrusion and the second protrusion are arranged alternately.

6. The light source unit of claim 1, wherein the LED package further comprises a first lead frame directly contact the first conductive member and a second lead frame directly contact the second conductive member.

7. The light source unit of claim 1, wherein the LED package further comprises a first lead frame and a second lead frame, and wherein the first lead frame is formed of the same material as the first conductive member or the second conductive member.

8. The light source unit of claim 1, wherein the LED package further comprises a first lead frame and a second lead frame, and wherein the second lead frame is formed of the same material as the first lead frame.

9. The light source unit of claim 1, wherein the LED package further comprises a first lead frame and a second lead frame, and wherein the LED chip is located on a surface of the second lead frame.

* * * * *